(12) United States Patent
Pulluru et al.

(10) Patent No.: US 12,087,387 B2
(45) Date of Patent: Sep. 10, 2024

(54) METHODS AND SYSTEMS FOR MANAGING READ OPERATION OF MEMORY DEVICE WITH SINGLE ENDED READ PATH

(71) Applicant: Samsung Electronics Co., Ltd., Suwon-si (KR)

(72) Inventors: Lava Kumar Pulluru, Bengaluru (IN); Poornima Venkatasubramanian, Bengaluru (IN); Manish Chandra Joshi, Bengaluru (IN); Ved Prakash, Bengaluru (IN); Pushp Khatter, Bengaluru (IN)

(73) Assignee: Samsung Electronics Co., Ltd., Gyeonggi-do (KR)

(*) Notice: Subject to any disclaimer, the term of this patent is extended or adjusted under 35 U.S.C. 154(b) by 179 days.

(21) Appl. No.: 17/750,690

(22) Filed: May 23, 2022

(65) Prior Publication Data

US 2023/0282251 A1   Sep. 7, 2023

(30) Foreign Application Priority Data

Mar. 2, 2022 (IN) .............................. 202241011338

(51) Int. Cl.
*G11C 7/10* (2006.01)
*H03K 3/037* (2006.01)

(52) U.S. Cl.
CPC .......... *G11C 7/1039* (2013.01); *G11C 7/1066* (2013.01); *G11C 7/1093* (2013.01); *H03K 3/0372* (2013.01)

(58) Field of Classification Search
CPC .............................. G11C 7/1039; G11C 7/10

USPC ....................................................... 365/233.1
See application file for complete search history.

(56) References Cited

U.S. PATENT DOCUMENTS

| | | | |
|---|---|---|---|
| 7,304,895 B2 | 12/2007 | Joshi et al. | |
| 7,463,508 B2 | 12/2008 | Pineda De Gyvez et al. | |
| 8,839,025 B2 | 9/2014 | Sivaramakrishnan et al. | |
| 8,854,858 B2* | 10/2014 | Bartling | G11C 11/419 365/207 |
| 8,908,449 B1* | 12/2014 | Ramaraju | H03K 3/0372 365/205 |
| 2007/0058466 A1 | 3/2007 | Joshi et al. | |
| 2014/0146630 A1* | 5/2014 | Xie | G06F 30/398 716/133 |

(Continued)

FOREIGN PATENT DOCUMENTS

WO   WO-2004/081948 A1   9/2004

*Primary Examiner* — Muna A Techane
(74) *Attorney, Agent, or Firm* — Harness, Dickey & Pierce, P.L.C.

(57) ABSTRACT

A memory device includes at least one bitcell; read circuitry coupled to the at least one bitcell; and screening circuitry coupled to the read circuitry, wherein the screening circuitry includes a master slave flip-flop configured to store an output of the at least one bitcell during a read operation of the memory device, wherein the master slave flip-flop includes a master latch and a slave latch; and a DOUT window controller coupled to the master slave flip-flop and configured to generate and control a master clock signal for the master latch to determine if the at least one bitcell is a weak bitcell; and generate and control a slave clock signal for the slave latch to enable toggling of the output of the at least one bitcell during a transparent window between the master clock signal and the slave clock signal.

18 Claims, 17 Drawing Sheets

(56) References Cited

U.S. PATENT DOCUMENTS

2022/0122655 A1\* 4/2022 Mathur ................ G11C 11/418

\* cited by examiner

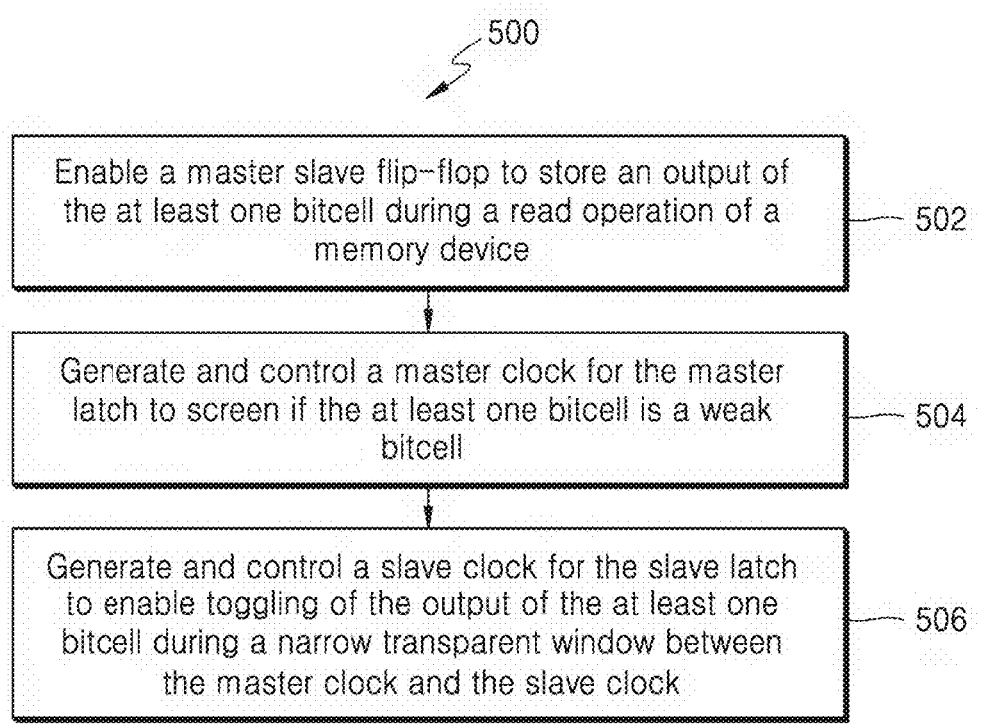

METHODS AND SYSTEMS FOR MANAGING READ OPERATION OF MEMORY DEVICE WITH SINGLE ENDED READ PATH

CROSS REFERENCE TO RELATED APPLICATION

This application claims priority to India application no. 202241011338 filed in the Indian Intellectual Property Office on Mar. 2, 2022, the content of which is incorporated herein by reference in its entirety.

BACKGROUND

1. Field

The present disclosure relates to the field of memory devices and, more particularly, to managing a read operation of a memory device with a single ended read path by screening weak bitcells and reducing an output toggling window.

2. Related Art

A strength of a bitcell in a memory device may be varied due to inherent process variations which have been more noticeable in advanced technology nodes of the memory device. The variation in the strength of the bitcell further varies an output delay in the memory device during a read operation of the memory device. The output delay in the memory device creates challenges in meeting System on Chip (SoC) timing requirements.

FIG. 1a depicts an example conventional Static Random-Access Memory (SRAM) device (an example of the memory device) with a single ended read path, wherein an output of the SRAM toggles in a wide window of time. The SRAM device includes one or more bitcells/memory cells 208, a NAND gate, a global read bit-line (GRBL) pull-down device, a latch 209, and a latch clock generator 207.

The bitcell 208 may be connected to a read word line (RWL) and a write word line (WWL). By activating the RWL and the WWL, the bitcell coupling to the RWL and the bitcell coupling to the WWL may be simultaneously read or written to through bit lines (i.e., a read bit line (RBL) and a write bit line (BLT and BLC)).

During a write operation of the SRAM, the WWL activates/goes high. When the WWL activates, transistors M5 and M6 transfer the data present on the BLT and the BLC into Q and Qb nodes respectively. The BLT and the BLC are complementary with respect to each other during the write operation. When the WWL is disabled (i.e., when there is no write operation), the BLT and the BLC may be in a pre-charge state (logic High).

During the read operation of the SRAM, as depicted in FIG. 1a, the RWL activates/goes high. When the RWL activates, the data bit stored in the storage node Qb may be read out to the RBL. While reading the data bit from the storage node Qb, the transistor M7/read port discharges a local bit line LRBLT(B). On discharging the LRBLT(B), the NAND gate toggles and enables the global GRBL pull-down device. The global GRBL pull-down device passes its value/GRBL value to the latch 209, which stores an output of the bitcell/SRAM. Depending on the strength of the bitcell, an access time of memory (Tacc) (i.e., time required to read the data from the memory and may be measured from a rising edge of the read operation clock to an output toggling) varies and the GRBL pull-down device may be enabled very late or sometimes very early. Thus, the output of the SRAM toggles in a wide window of time (output toggling window), since the latch is transparent, as depicted in FIG. 1b. Toggling of the output of the SRAM in the wide window of time may create challenges in meeting the SOC level timing. Therefore, detecting the strength of the bitcell or screening a weak bitcell may play an important role in preventing the toggling of the output in the wide window of time. However, the conventional approaches do not involve any mechanism to detect the strength of the bitcell or screening a weak bitcell.

SUMMARY

According to at least some example embodiments of the inventive concepts, a memory device includes at least one bitcell; read circuitry coupled to the at least one bitcell; and screening circuitry coupled to the read circuitry, wherein the screening circuitry includes a master slave flip-flop configured to store an output of the at least one bitcell during a read operation of the memory device, wherein the master slave flip-flop includes a master latch and a slave latch; and a DOUT window controller coupled to the master slave flip-flop and configured to generate and control a master clock signal for the master latch to determine if the at least one bitcell is a weak bitcell; and generate and control a slave clock signal for the slave latch to enable toggling of the output of the at least one bitcell during a transparent window between the master clock signal and the slave clock signal.

According to at least some example embodiments of the inventive concepts, screening circuitry in a memory device includes a master slave flip-flop configured to store an output of at least one bitcell during a read operation of the memory device, wherein the master slave flip-flop includes a master latch and a slave latch; and a DOUT window controller coupled to the master slave flip-flop configured to generate and control a master clock signal for the master latch to determine if the at least one bitcell is a weak bitcell; and generate and control a slave clock signal for the slave latch to enable toggling of the output of the at least one bitcell during a transparent window between the master clock signal and the slave clock signal.

According to at least some example embodiments of the inventive concepts, a method for managing a read operation of a memory device includes generating and controlling, by a DOUT window controller of screening circuitry, a master clock signal for a master latch of a master slave flip-flop to determine if at least one bitcell is a weak bitcell, wherein the master slave flip-flop is configured to store an output of the at least one bitcell during the read operation of the memory device; and generating and controlling, by the DOUT window controller, a slave clock signal for a slave latch of the master slave flip-flop to enable toggling of the output of the at least one bitcell during a transparent window between the master clock signal and the slave clock signal.

BRIEF DESCRIPTION OF FIGURES

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 5 is a flow diagram depicting a method for managing the read operation of the memory device, according to at least some example embodiments of the inventive concepts;

DETAILED DESCRIPTION

Figure 1A:
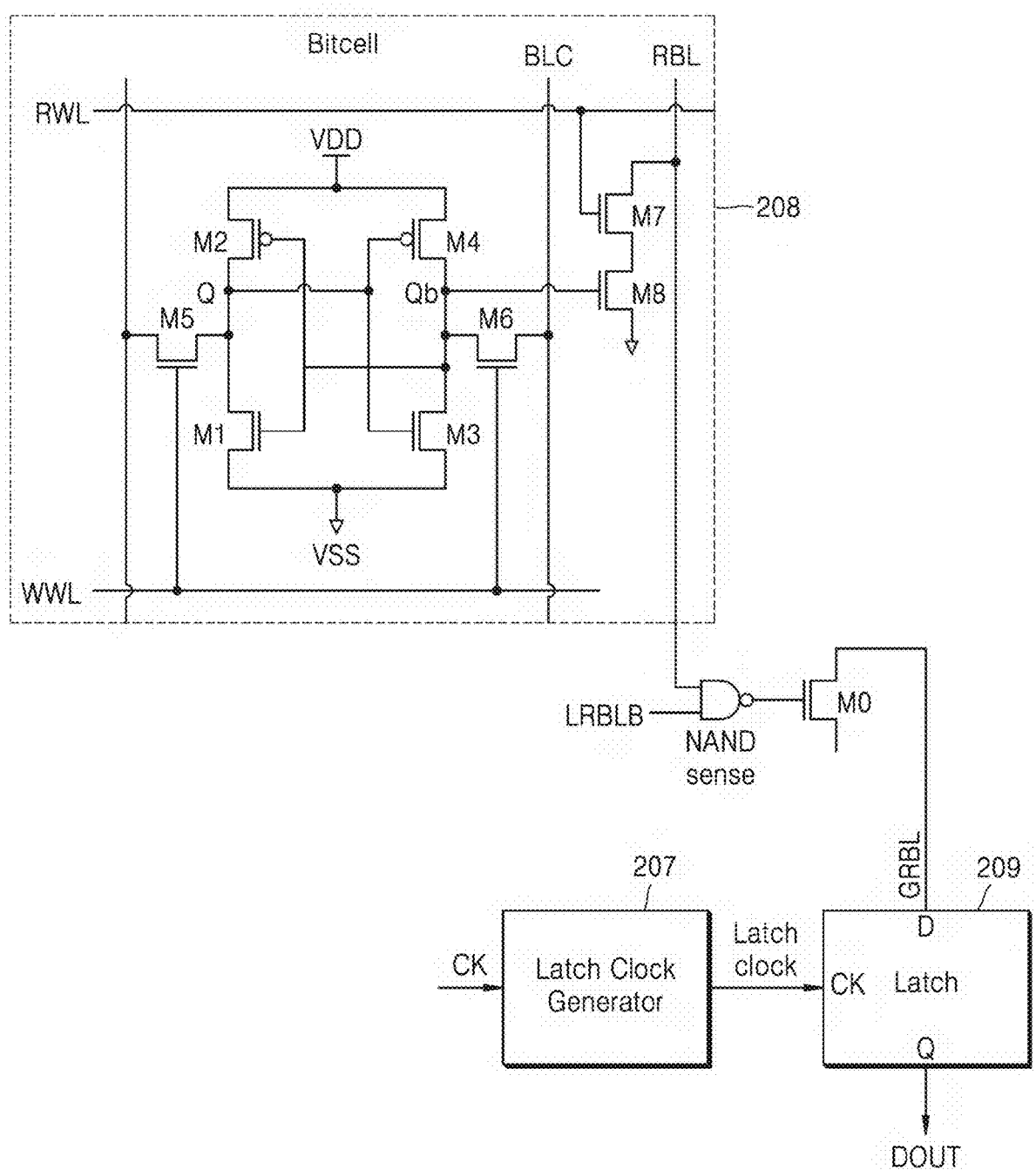
FIG. 1A depicts an example conventional Static Random-Access Memory (SRAM) device with a single ended read path, wherein an output of the SRAM toggles in a wide window of time.
Figure 1B:
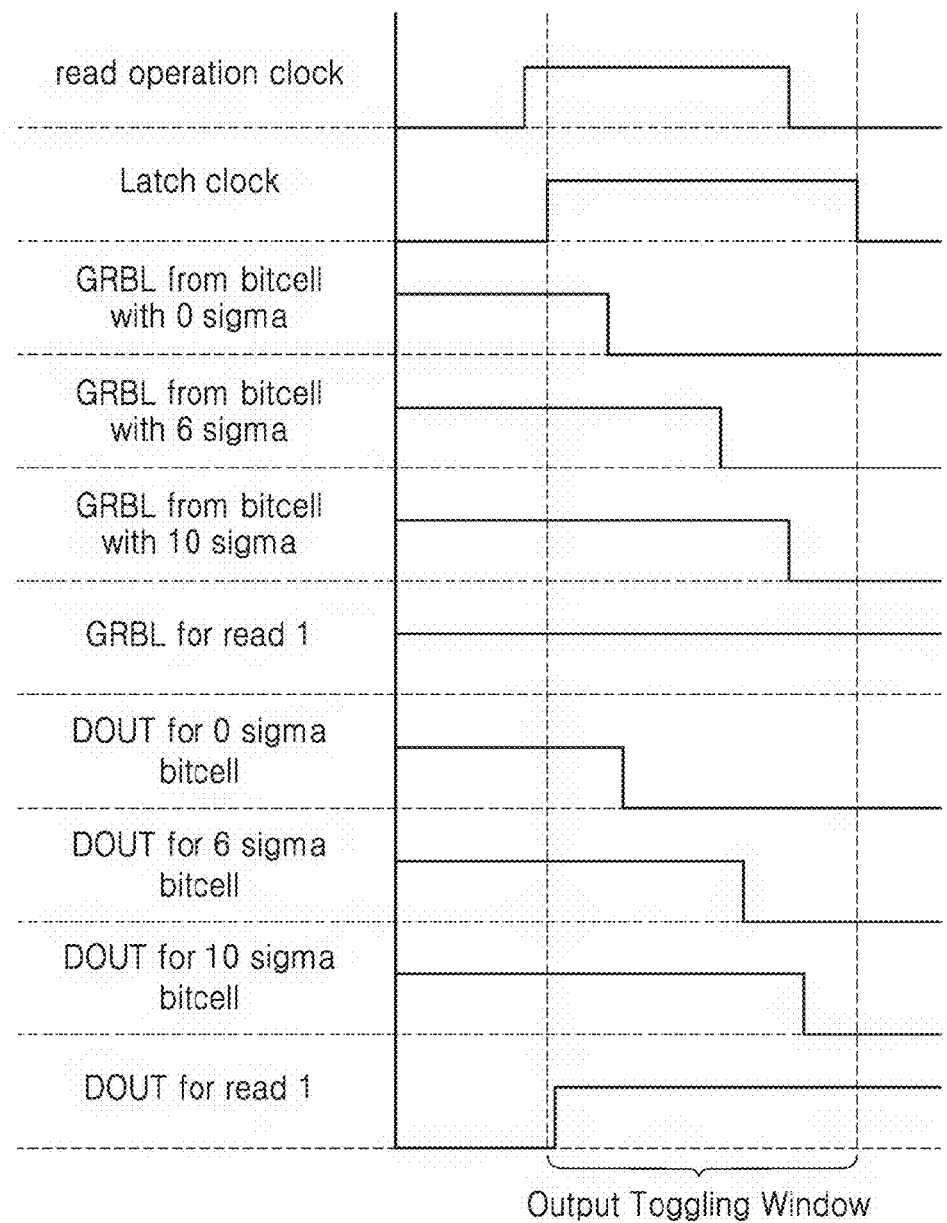
FIG. 1B is a timing diagram depicting a read operation performed on the conventional SRAM with the single ended read path.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

At least some example embodiments of the inventive concepts disclose methods and systems for screening a weak bitcell in a memory device and reducing an output toggling window without adding additional latency to a read operation of the memory device.

At least one object of the embodiments herein is to disclose methods and systems for managing a read operation of a memory device by screening out a weak bitcell in a memory device and reducing a toggling output window without adding additional latency to the read operation of the memory device.

Another object of the embodiments herein is to disclose methods and systems for deploying a master slave flip-flop comprising a master latch and a slave latch for storing an output of the bitcell and generating and controlling a master clock signal and a slave clock signal for the master latch and the slave latch respectively, to screen the bitcell (e.g., by determining if the bitcell is a weak bitcell and screening out the bitcell if the bitcell is determined to be a weak bitcell) and to reduce the output toggling window. In the present specification, the term "clock signal" may be referred to, simply, a "clock" (e.g., a master clock, a slave clock, a latch clock, etc.)

Referring now to the drawings, and more particularly to FIGS. 2a through 10, where similar reference characters denote corresponding features consistently throughout the figures, there are shown at least some example embodiments of the inventive concepts.

FIGS. 2a-2e depict a memory device 200 with a single ended read data path, according to at least some example embodiments of the inventive concepts. The memory device 200 referred to herein may be a memory that uses a latching circuitry to store data and includes a single ended read data path. The single ended read data path refers to providing of the data/data signal from a bitcell in a memory array to a data output terminal. Examples of the memory device 200 may include, but are not limited to, a Static Random-Access Memory (SRAM), a Synchronous Dynamic Random Access Memory, a Read Only Memory (ROM) or any other memory device with the single ended read data path.

In an example, the memory device 200 may be embodied as an independent device. In another example, the memory device 200 may be included in other devices. Examples of such other devices include, but are not limited to, a semiconductor memory device, a system device (system-on-chip (SOC)), a semiconductor die/chip, and so on.

The memory device 200 includes one or more memory arrays 202 (also referred as bitcell arrays 202 or memory banks 202), a read circuitry 204, and a screening circuitry 206. The memory device 200 also includes a row selection circuit, a column selection circuit, a read-write circuit, and so on (not shown). According to at least some example embodiments of the inventive concepts, the memory device 200 and/or elements thereof, may be, or include, processing circuitry such as hardware including logic circuits; a hardware/software combination executing software; or a combination thereof. For example, the processing circuitry more specifically may include, but is not limited to, one or more of a central processing unit (CPU), a processor core, an arithmetic logic unit (ALU), a digital signal processor, a microcomputer, a field programmable gate array (FPGA), a programmable logic unit, a microprocessor, an application-specific integrated circuit (ASIC), etc. For example, according to at least some example embodiments of the inventive concepts, the memory device 200 may also include a control logic that controls operations of the memory device 200 including any or all of the operations described herein with respect to of the memory device 200, the read circuitry 204, the screening circuitry 206, and so on. The control logic included in the memory device 200 may be implemented as a circuit, as one or more programs (e.g., software/firmware) or a combination of circuitry and software. For example, processing circuitry of the control logic of the memory device 200 may be or include a processor. According to at least some other example embodiments of the inventive concepts, the operations of the memory device 200 may be controlled by an external device. The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multi-processor, an application-specific integrated circuit (ASIC), a field programmable gate array (FPGA), and so on.

The memory array 202 may be configured to store data/data bits. In an example, the data may refer to information bits. In another example, the data may refer to a data signal or data signals indicating the information bits. The data signal may be a voltage signal or a current signal. In another example, the data signal may refer to both a state and the data signals. The memory array 202 is depicted in FIG. 2b.

Figure 2A:
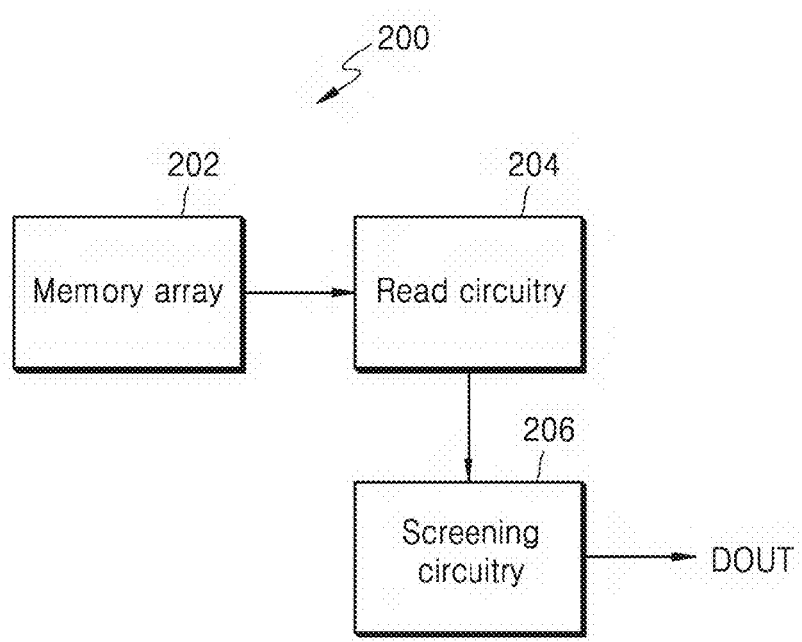
FIGS. 2A-2E depict a memory device with a single ended read data path, according to at least some example embodiments of the inventive concepts.
Figure 2B:
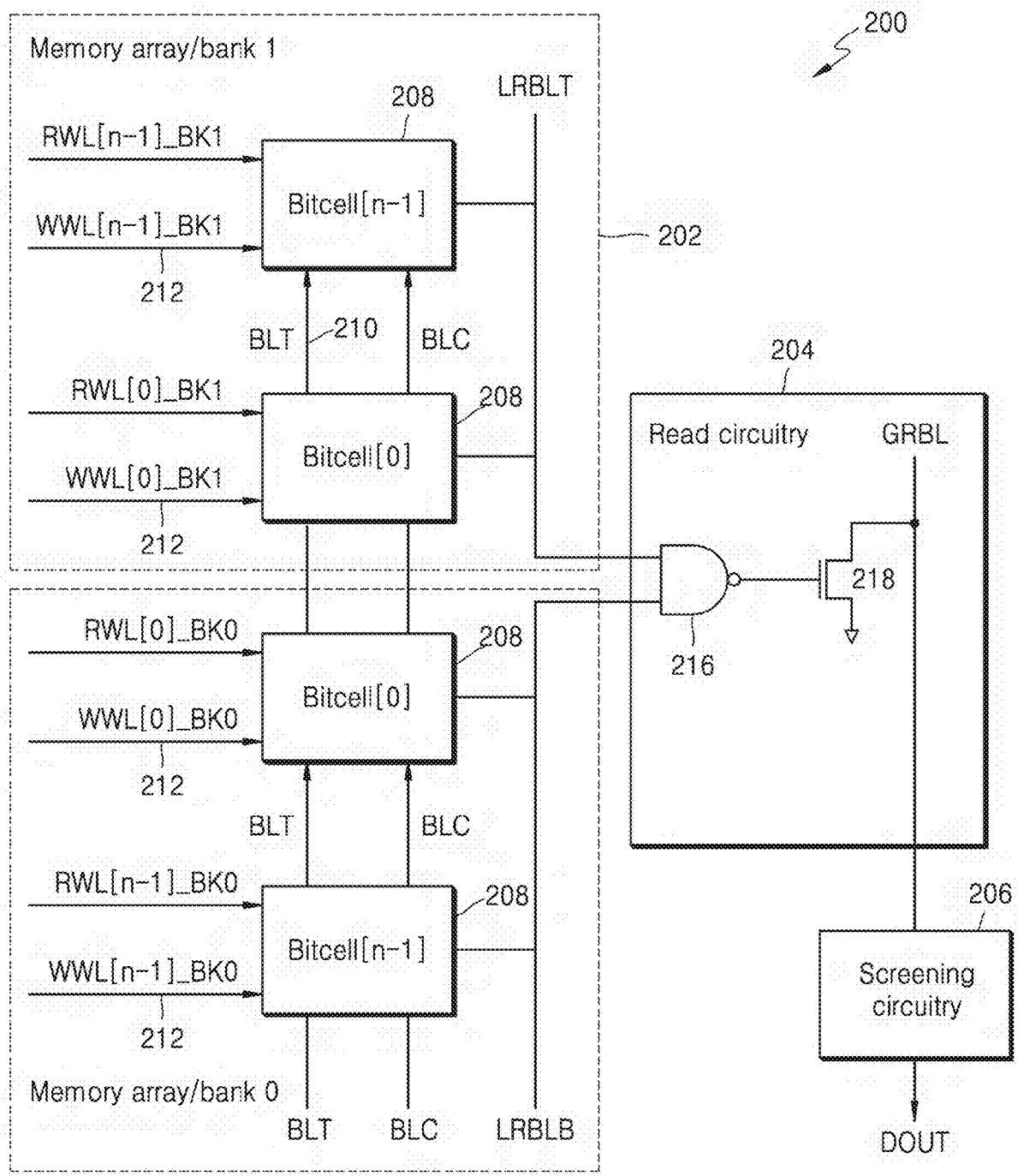

As depicted in FIG. 2b, the memory array 202 includes a plurality of memory cells/bitcells 208, a plurality of bit lines, and a plurality of word lines. The plurality of bit lines (BL) 210 include a read bit line (RBL) (as depicted in FIG. 2b) and a write bit line (BLT/BLC). The bit lines 210 may be coupled with local bit lines (LRBL), which have been connected with global bit lines (GBL) via switches. For example, the RBL may be coupled with local read bit lines (LRBL) (for example, a local read bit line from a bottom bank (LRBLB), a local read bit line from a top bank (LRBLT), or the like), which have been sensed with a logic/NAND gate 216 of the read circuitry 204 that enables a global read bit line (GRBL) control device 218. The plurality of word lines include a read word line (RWL) 212a (as depicted in FIG. 2c) and a write word line (WWL) 212b.

The bitcell 208 may be configured to store the data bit. A read operation may be performed on the bitcell 208 to read/access the stored data bit. A write operation may be performed on the bitcell 208 to store the data bit. A structure of the bitcell 208 may vary depending on the memory device 200.

Figure 2C:
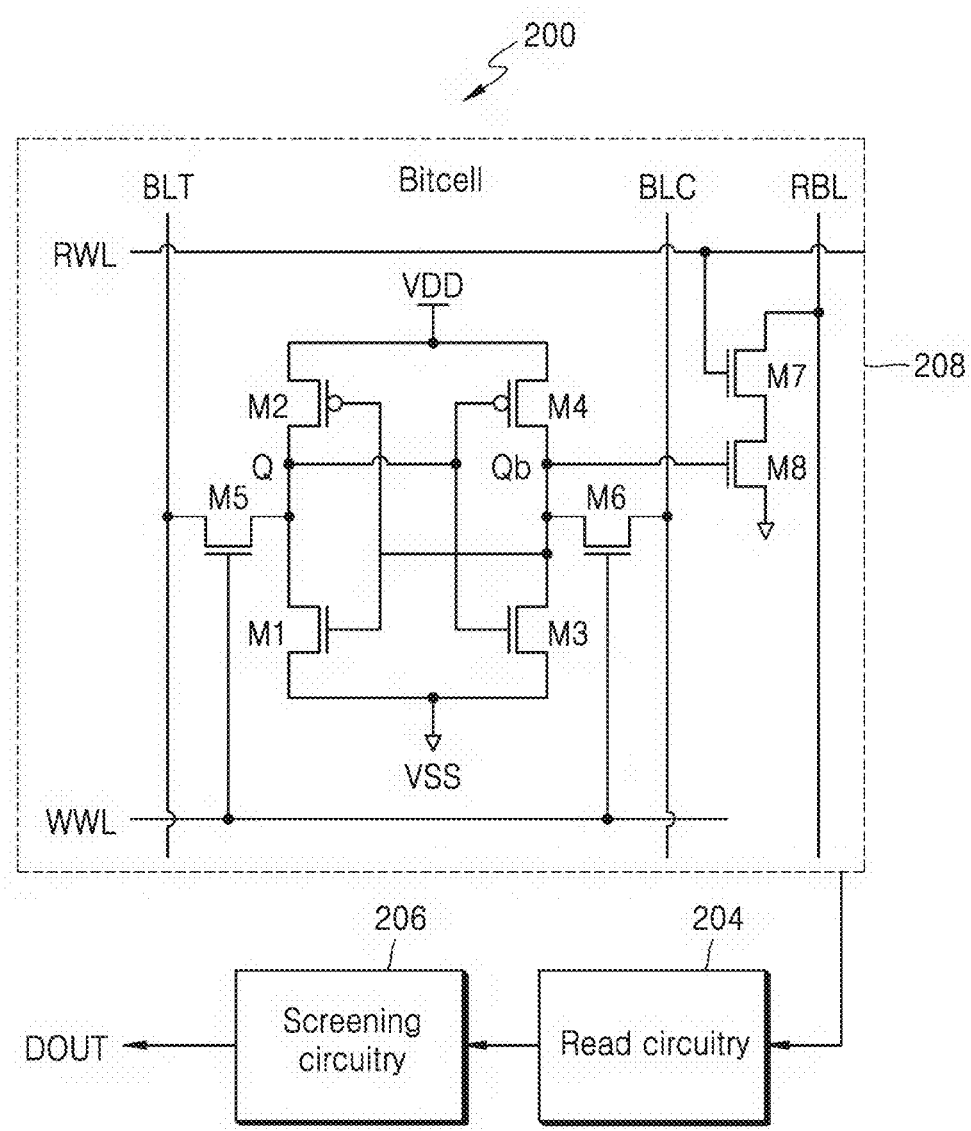

In example, the bitcell 208 of a SRAM (an example of the memory device 200) is depicted in FIG. 2c. As depicted in FIG. 2c, the bitcell 208 includes a plurality of transistors M1-M8, and data storage nodes Q and Qb. The transistors M1-M8 may be N-type metal-oxide semiconductor (NMOS) switching transistors. The transistors M1 to M4 form a latch structure for storing the data. The transistors M5 and M6 are access transistors through which the data present on the BLT and BLC may be written into the Q and Qb nodes respectively.

Figure 2D:
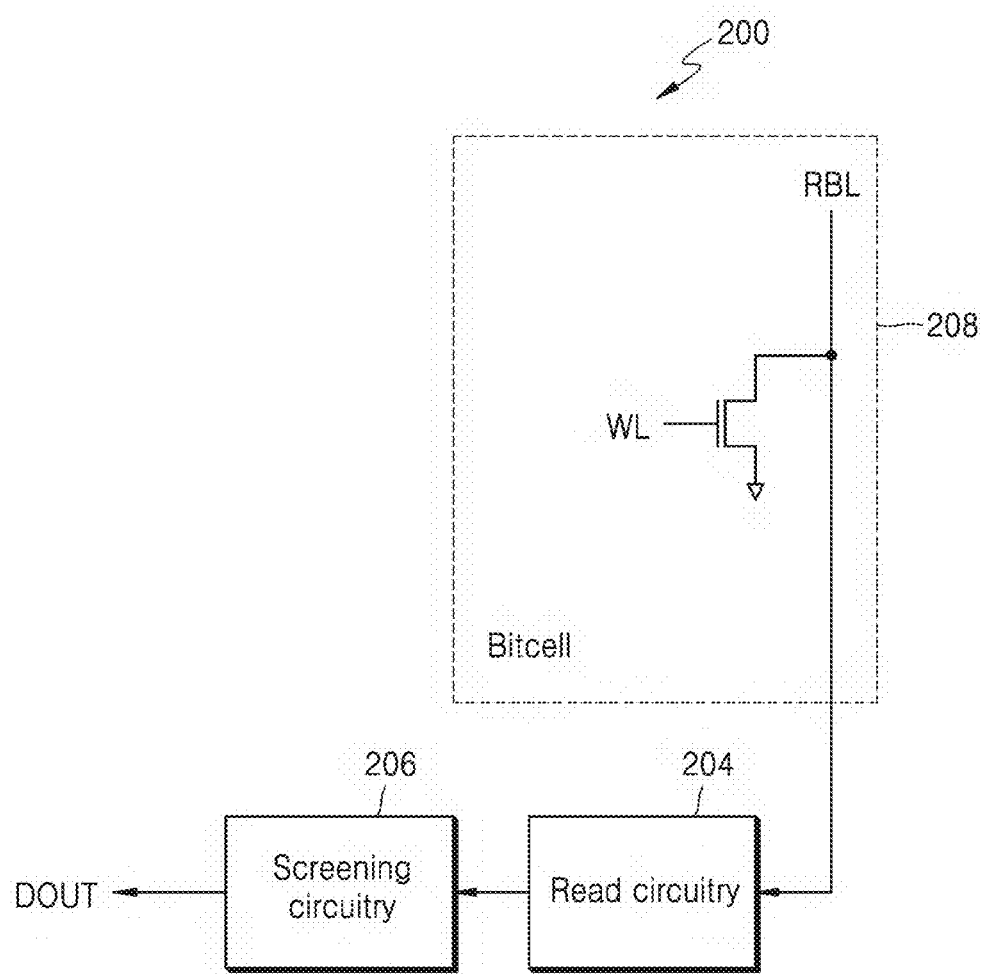

In another example, the bitcell 208 of a ROM (an example of the memory device 200) is depicted in FIG. 2d.

Figure 2E:
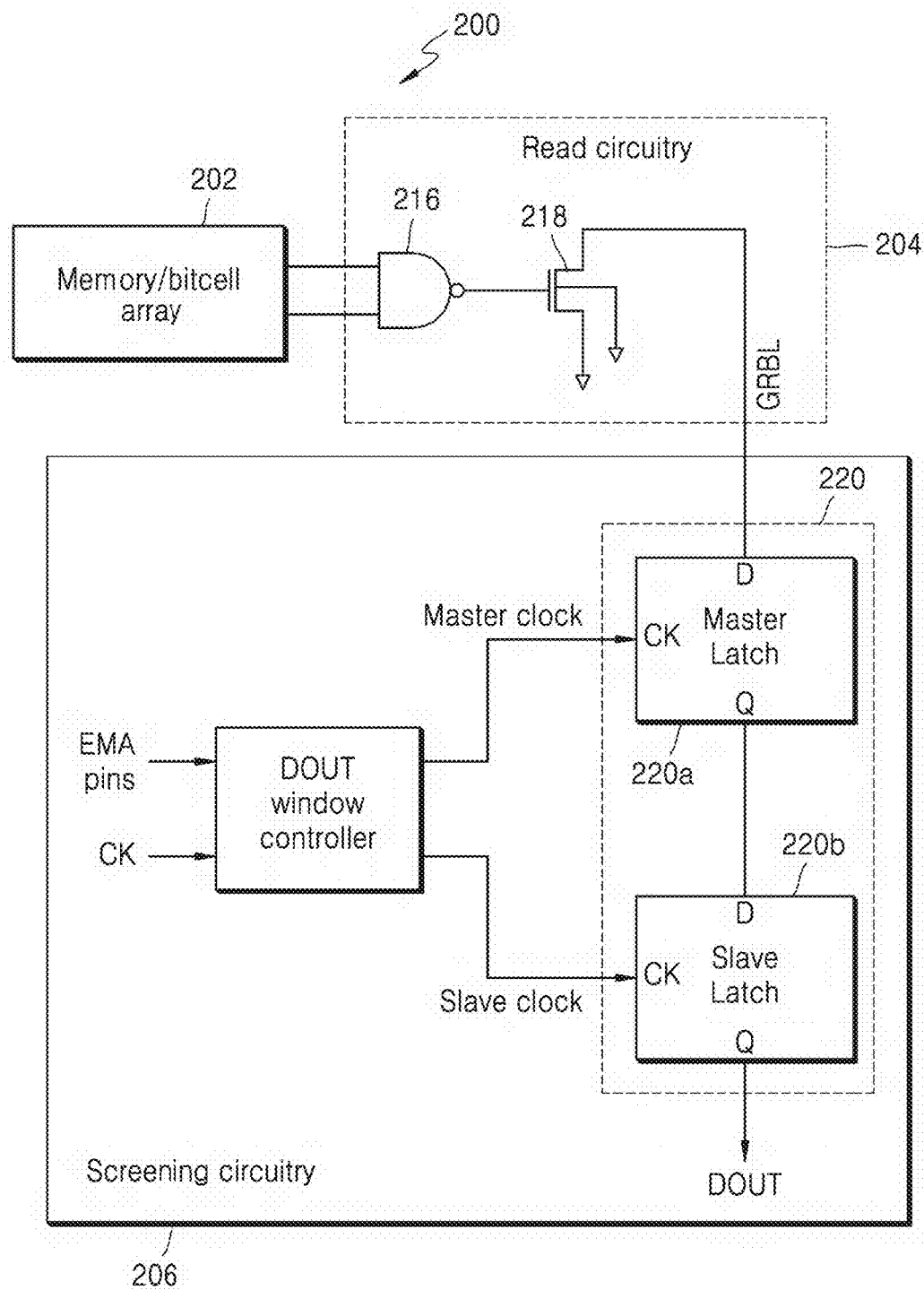

The read circuitry 204 may be configured to read the data retrieved by the bitcell 208 from the storage node Qb and latch the read data. The read circuitry 204 is depicted in FIG. 2b and FIG. 2e. As depicted in FIG. 2b and FIG. 2e, the read circuitry 204 includes the logic gate 216, and the GRBL control device/pull-down device 218.

The logic gate 216 may be coupled with the plurality of LRBLs (LRBLB, LRBLT, or the like). According to at least one example embodiment of the inventive concepts, the logic gate 216 may be a NAND gate. The logic gate 216 may be enabled, when the bit cell 208 discharges the LRBLT to '0'. On being enabled, the logic gate 216 performs a logical operation (for example, a NAND operation) on values of the LRBLs (the LRBLT, and the LRBLB) coupled with the bitcell 208 and generates a logic gate output, which may be fed to the GRBL pull-down device 218. Thereby, the logic gate 216 reads the data stored by the bitcell 208 at the storage node Qb.

The GRBL pull-down device 218 may be a field-effect transistor (FET) transistor comprising a drain connected to the GRBL. The logic gate output enables the GRBL pull-down device 218 and pulls down the GRBL/GRBL value associated with the GRBL pull-down device 218. At least some example embodiments of the inventive concepts are described using terms such as "GRBL", "GRBL value", "GRBL output", and so on, interchangeably to refer to a value of the GRBL connected with the GRBL pull-down device 218.

The screening circuitry 206 includes a master slave flip-flop 220, and a DOUT window controller 222. According to at least some example embodiments, the DOUT window controller 222 may be or include processing circuitry. The screening circuitry 206 is depicted in FIG. 2e.

The master slave flip-flop 220 may be configured to latch the data read by the logic gate 216 by reading the GRBL value associated with the GRBL pull-down device 218. The master slave flip-flop 220 comprises a master latch 220a and a slave latch 220b. The master latch 220a and the slave latch 220b may be a D-latch. The master latch 220a reads the GRBL value and feeds to the slave latch 218b, which provides an output (DOUT) of the memory device 200 at the data output terminal.

The DOUT window controller 222 may be configured to manage the read operation of the memory device 200 by generating and controlling a master clock and a slave clock separately for the master latch 220a and the slave latch 220b, respectively. The DOUT window controller 222 generates the master clock and the slave clock based on a read operation clock and user pins. In an example, the user pins may include Extra Margin Adjustment (EMA) pins.

According to at least one example embodiment of the inventive concepts, the DOUT window controller 222 generates and controls the master clock for the master latch 220a in such a way that the screening circuitry 206 may detect if the bitcell 208 is a weak bit cell or not. Thereby, detecting a strength of the bit cell 208.

According to at least one example embodiment of the inventive concepts, the DOUT window controller 222 generates and controls the slave clock for the slave latch 220b in such a way that the output of the bit cell 208/memory device 200 may toggle during a narrow transparent window generated between the master clock and the slave clock. The narrow transparent window may be a duration of time through which both the master latch 220a and the slave latch 220b simultaneously pass their respective inputs to their respective outputs. In the narrow transparent window, the output of the bitcell 208 may toggle. Thus, the latency of the read operation may be reduced, as the output of the bitcell 208/memory device 200 toggles only during the narrow window of time. At least some example embodiments of the inventive concepts are described using the terms such as "narrow transparent window", "output toggling window", "narrow window of time", and so on, interchangeably through the document. The DOUT window controller 222 is depicted in detail in conjunction with FIG. 3.

The screening circuitry 206 may be configured to screen the bitcell 208 (e.g., by determining if the bitcell 208 is a weak bitcell and screening out the bitcell 208 if the bitcell is determined to be a weak bitcell). The screening circuitry 206 may determine that the bitcell 208 is a weak bitcell if the GRBL associated with the bitcell 208 toggles (which may be referred hereinafter as a GRBL toggling) beyond a closing edge of the master clock.

Upon determining that the bit cell 208 is a weak bitcell, the screening circuitry 206 compares a sigma of a weak bitcell 208 with a pre-defined or, alternatively, desired threshold sigma. The sigma may be metric, which depicts strength of the bitcell 208. If the sigma of a weak bitcell is higher than the pre-defined sigma (i.e., the weakness of the bitcell is greater than the weakness indicated by the pre-defined sigma), the screening circuitry 206 screens out the bitcell 208 by preventing a passing of the GRBL through the output of the master slave flip-flop 220. Thus, according to at least some example embodiments, "screening out" a bitcell includes preventing (e.g., by the screening circuitry 206) the passing of the GRBL corresponding to the bitcell through the output of the master slave flip-flop 220.

FIGS. 2a-2e show examples of blocks of the memory device 200, but it is to be understood that at least some example embodiments of the inventive concepts are not limited thereto. In other embodiments, the memory device 200 may include less or more number of blocks. Further, the labels or names of the blocks are used only for illustrative purpose and does not limit the scope of example embodiments of at least some example embodiments of the inventive concepts. One or more blocks can be combined together to perform same or substantially similar function in the memory device 200.

Figure 3:
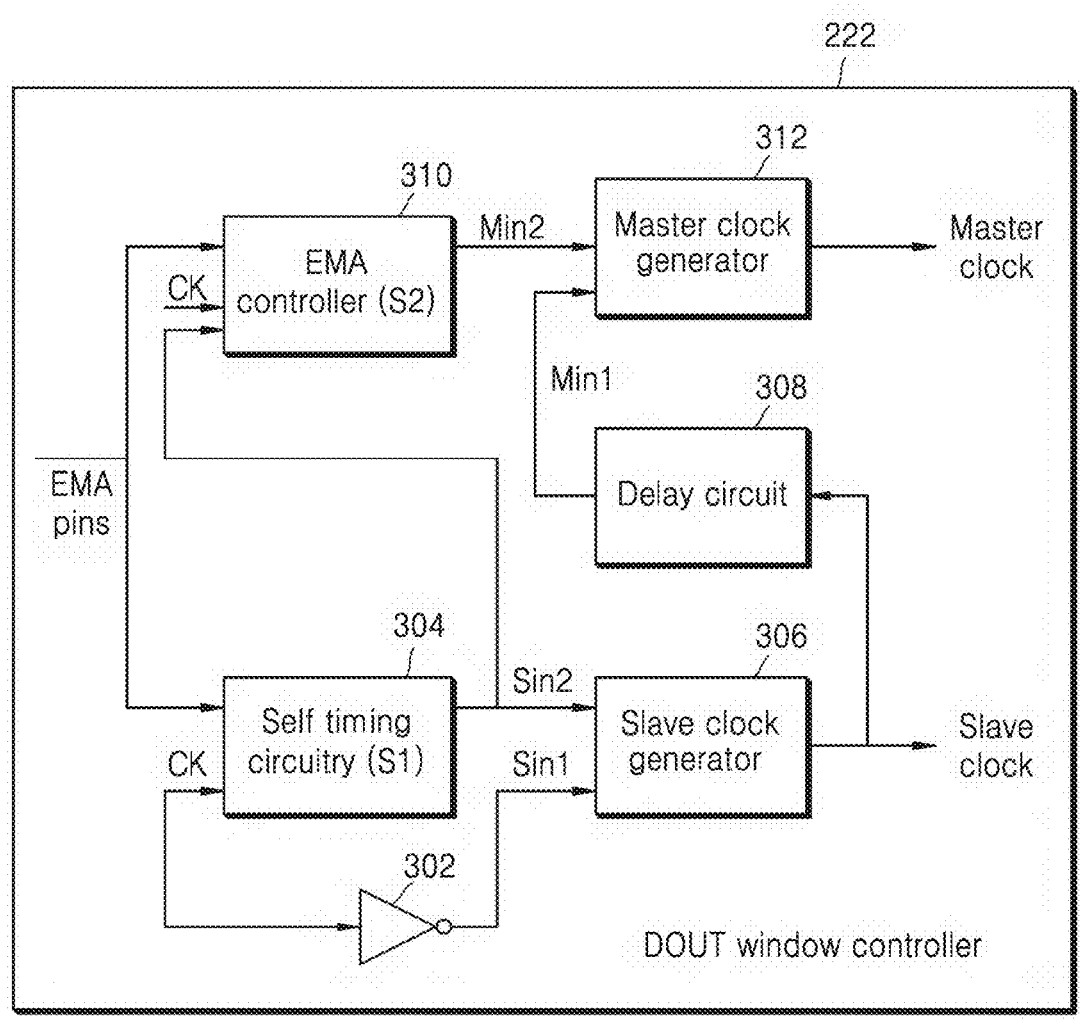
FIG. 3 is an example block diagram depicting components of a DOUT window controller for controlling a master clock and a slave clock for a master latch and a slave latch, respectively, according to at least some example embodiments of the inventive concepts.

FIG. 3 is an example block diagram depicting components of the DOUT window controller 222 for controlling the master clock and the slave clock for the master latch 220a and the slave latch 220b, respectively, according to at least some example embodiments of the inventive concepts. The DOUT window controller 222 comprises an inverter circuit 302, a self-timing circuitry (S1) 304, and a slave clock generator 306 to generate and control the slave clock for the slave latch 220b. The slave clock generator 306 may be coupled with the inverter circuit 302 and the self-timing circuitry 304.

The inverter circuit 302 may be configured to generate a first slave signal (Sin 1). The inverter circuit 302 receives the read operation clock (CK) and generates an inversion of the read operation clock as the first slave signal. The inverter circuit 302 provides the first slave signal to the slave clock generator 306.

The self-timing circuitry 304 may be configured to generate a second slave signal (Sin 2). The self-timing circuitry 304 generates the second slave signal based on the read operation clock and the user input/EMA pin. The self-timing circuitry 304 provides the second slave signal to the slave clock generator 306.

The slave clock generator 306 may be coupled to generate the slave clock for the slave latch 220b based on the first slave signal and the second slave signal. The slave clock generator 306 provides the slave clock to the slave latch 220b.

According to at least one example embodiment of the inventive concepts, the self-timing circuitry 304 and the slave clock generator 306 may be further configured to control the slave clock for the slave latch.

The slave clock generator 306 triggers a rising edge of the slave clock at a rising edge of the read operation. The rising edge of the slave clock closes the slave latch 220b. The self-timing circuitry 304 models the delay of the memory device 200 by modelling the dummy RWL, the read port/transistor 208a, the logic gate 216, and the GRBL pull-down device 218 associated with the bitcell 208. According to at least one example embodiment of the inventive concepts, the self-timing circuitry 304 generates an opening edge of the slave clock (#3, as depicted in FIG. 4b) before a closing edge (#4, as depicted in FIG. 4b) of the master clock, due to modeling the delay of the memory device 200. Generation of the opening edge of the slave clock before the closing edge of the master clock creates the narrow transparent window between the master clock and the slave clock. Thus, the output of the memory device 200 may toggle only in the narrow transparent window, which is between the edge #3 and the edge #4.

The DOUT window controller 222 further comprises a delay circuit 308, an EMA controller (S2) 310, and a master clock generator 312 to generate and control the master clock for the master latch 220a. The master clock generator 312 may be coupled with the delay circuit 308, and the EMA controller 310. According to at least some example embodiments, the EMA controller 310 may be or include processing circuitry.

The delay circuit 308 may be configured to generate a first master signal (Min1). The delay circuit 308 generates the first master signal by adding a delay to the slave clock generated by the slave clock generator 306. The delay is configured to the duration of the narrow transparent window where both master latch 220a and the slave latch 220b are transparent. The delay circuit 308 provides the first master signal to the master clock generator 312.

The EMA controller 310 may be configured to generate a second master signal (Min2). According to at least some example embodiments, the EMA controller may be or include processing circuitry. The EMA controller 310 generates the second master signal based on the user input/EMA pins, the read operation clock, and the second slave signal. The EMA pins may be controlled by a user to allow the weakness of the bitcell 208 that can be accessed successfully. The EMA pins may be controlled by controlling the closing edge of the master clock. The EMA controller 310 provides the second master signal to the master clock generator 312.

The master clock generator 312 may be configured to generate the master clock based on the first master signal and the second master signal. The master clock generator 312 provides the master clock to the master latch 220a for operating.

According to at least one example embodiment of the inventive concepts, the master clock generator 312 and the EMA controller 310 may be further configured to control the master clock for the master latch 220a. The master clock generator 312 triggers a rising edge of the master clock after the rising edge of the slave clock, which has been passed through the delay circuit 308. The rising edge of the master clock opens the master latch 220a (i.e., the master latch becomes transparent). The master clock generator 312 triggers the rising edge of the master clock (#2, as depicted in FIG. 4b) after the rising edge of the slave clock (#1, as depicted in FIG. 4b) to prevent a loss of the data read from a previous read cycle. The rising edge of the master clock opens the master clock. The EMA controller 310 generates the closing edge of the master clock based on the user input/EMA pins to control a range of sigma required to be detected. The occurrence of the GRBL toggling with respect to the closing edge of the master clock may be monitored by the screening circuitry 206 to screen the bitcell 208 (e.g., by determining if the bitcell 208 is a weak bitcell and screening out the bitcell 208 if the bitcell 208 is determined to be a weak bitcell). If the GRBL toggling occurs beyond the closing edge of the master clock, the screening circuitry 206 detects the associated bitcell 208 as a weak bitcell.

FIG. 3 show examples of blocks of the DOUT window controller 222, but it is to be understood that at least some example embodiments of the inventive concepts are not limited thereto. In other embodiments, the DOUT window controller 222 may include less or more number of blocks. Further, the labels or names of the blocks are used only for illustrative purpose and does not limit the scope of at least some example embodiments of the inventive concepts. One or more blocks can be combined together to perform same or substantially similar function in the DOUT window controller 222.

Figure 4A:
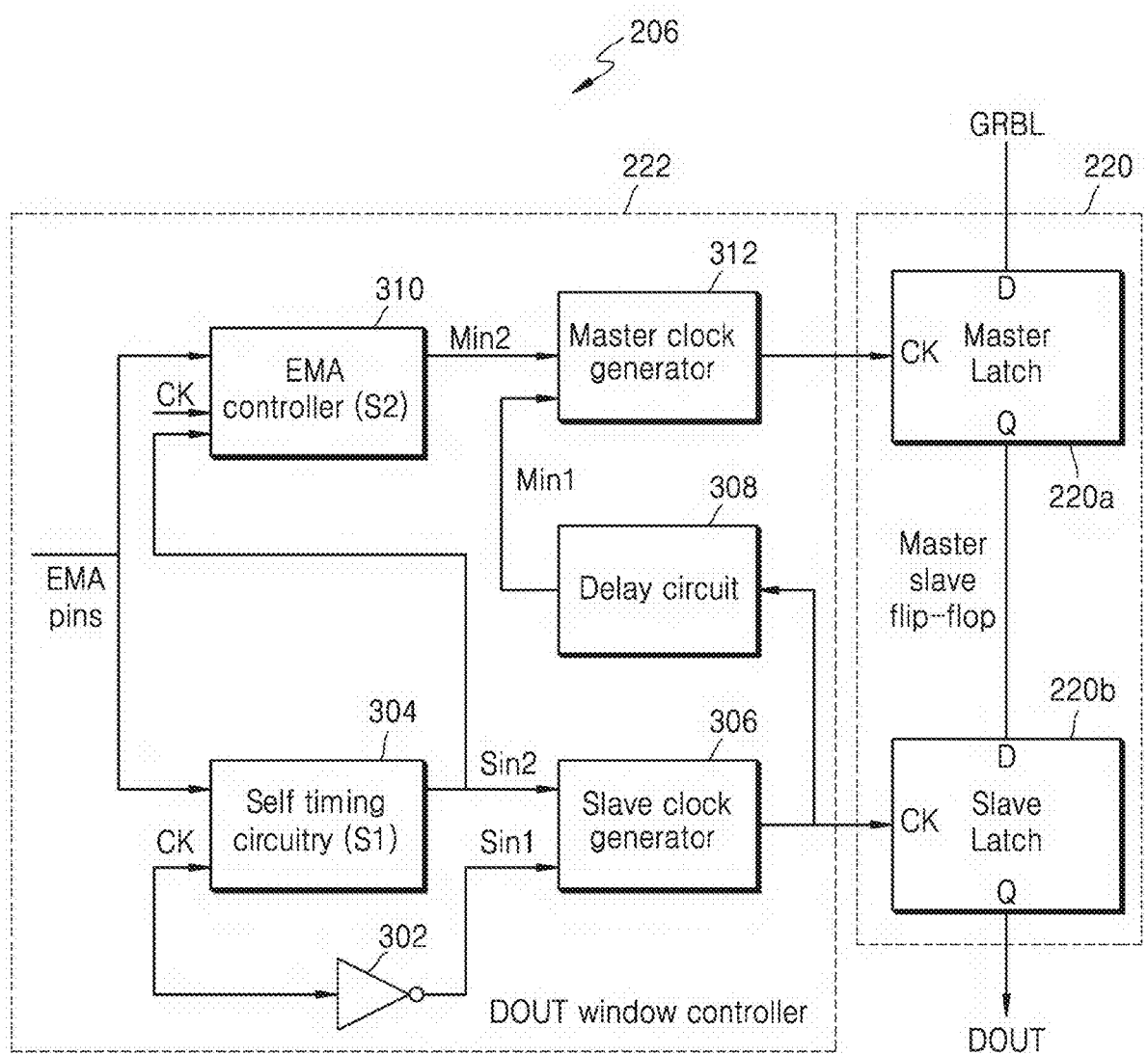
FIG. 4A is an example diagram depicting generating and controlling of the master clock and the slave clock for screening a weak bitcell and enabling the output of the memory device to toggle only in a narrow transparent window created between the master clock and the slave clock, according to at least some example embodiments of the inventive concepts.
Figure 4B:
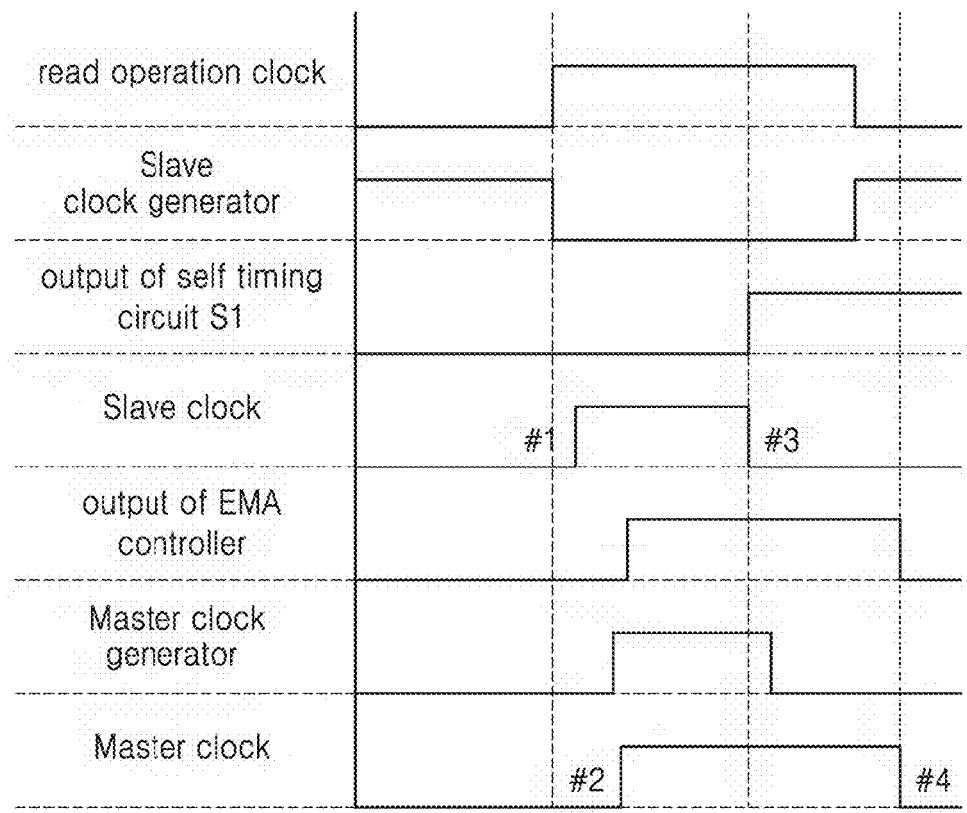
FIG. 4B is an example timing diagram depicting generation of the master clock and the slave clock, according to at least some example embodiments of the inventive concepts.

FIG. 4a is an example diagram depicting generating and controlling of the master clock and the slave clock for screening a weak bitcell (e.g., determining if a bitcell is a weak bitcell and screening out the bit cell if the bit cell is determined to be the weak bit cell) and enabling the output of the memory device 200 to toggle only in the narrow transparent window created between the master clock and the slave clock, according to at least some example embodiments of the inventive concepts.

As depicted in FIG. 4a, the master slave flip-flop comprises the master latch 220a and the slave latch 220b to store the output of the bitcell/memory device 200. The DOUT window controller 222 generates the master clock for the master latch 220a and controls the master clock to screen out weak bitcells based on the EMA pins and the read operation clock. The DOUT window controller 222 also generates the slave clock for the slave latch 220b and controls the slave clock in such a way that the output of the memory device 200 has to toggle only in the narrow transparent window created between the master clock and the slave clock. Thus, reducing output toggling window. In addition, the DOUT window controller 222 may generate and control the master clock and the slave clock for the master latch 220a and the slave latch respectively, without adding additional latency to the read operation of the memory device 200.

The DOUT window controller 222 includes the inverter circuit 302, the self-timing circuitry 304, and the slave clock generator 306 to generate the slave clock based on the read operation clock and the EMA pins. The DOUT window controller 222 includes the delay circuit 308, the EMA controller 310, and the master clock generator 312 to generate the master clock based on the read operation clock, the EMA pins, and the slave clock.

A timing diagram of generating the master clock and the slave clock is depicted in FIG. 4b. The slave clock generator 306 with inputs from the read operation clock and the self-timing circuitry 304 generates the slave clock. The rising edge of the read operation clock triggers the rising edge of the slave clock (edge #1), which closes the slave latch 220b. The self-timing circuitry 304 models the delay of the memory device 200 by modelling the dummy RWL, the read port 208a, the logic/NAND gate 216 and the GRBL pull down (e.g., a GRBL pull down operation of a GRBL pull down device) associated with the bitcell 208 and accordingly positions the opening edge (edge #3) of the slave clock to minimize or, alternatively, reduce a timing penalty.

The master clock generator 312 with inputs from the delayed slave clock, the read operation clock and the EMA pins generates the master clock for the master latch 220a. The rising edge of the slave clock (edge #1) after passing through the delay circuit 308 triggers the rising edge (edge #2) of the master clock, which opens the master clock. The EMA controller 310 along with the EMA pins triggers the closure of the master clock (edge #4 (i.e., the closing edge of the master clock)) to control the range of sigma required to be detected.

Figure 4C:
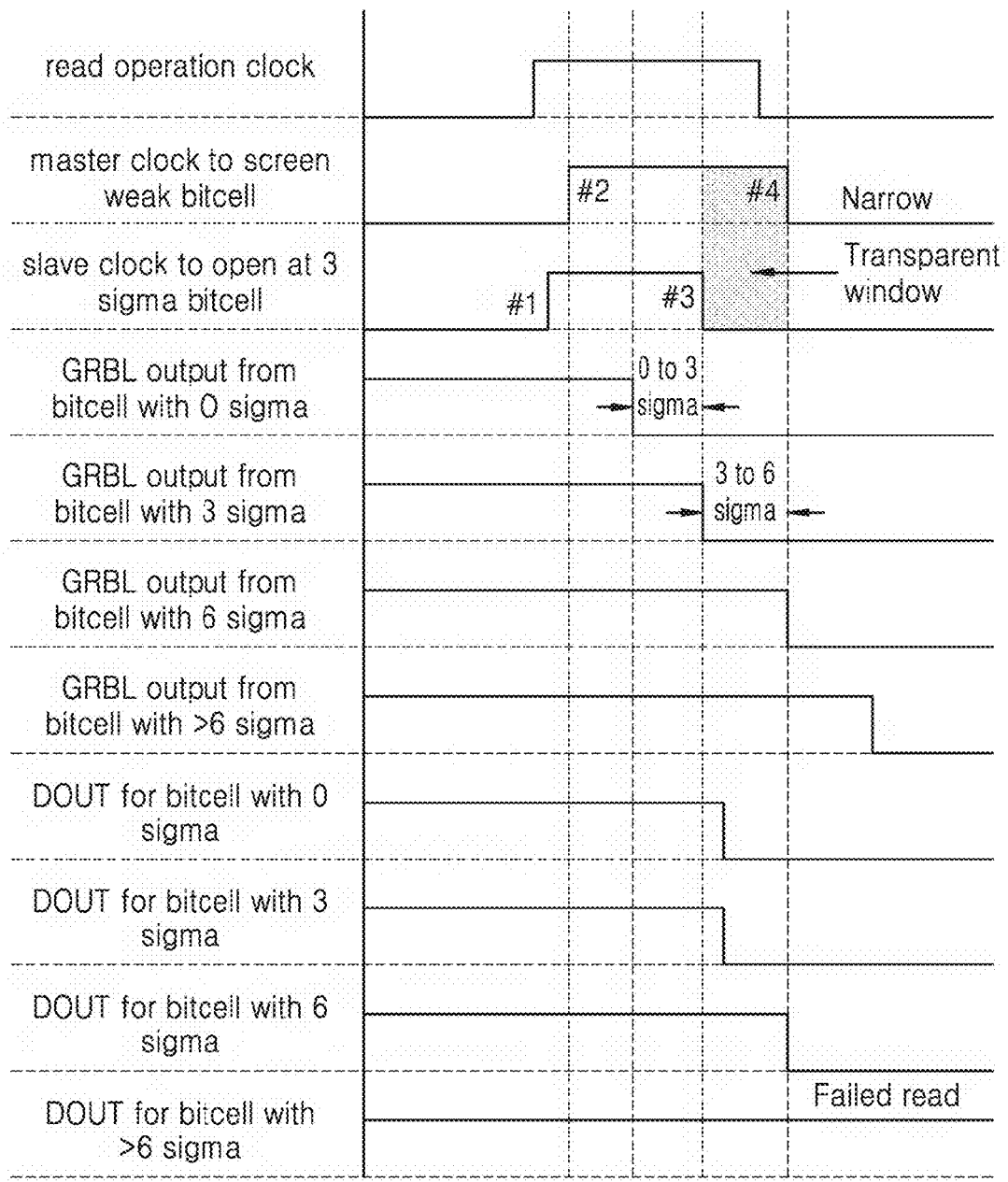
FIG. 4C is an example timing diagram depicting a read operation performed on the memory device with the single ended read path, according to at least some example embodiments of the inventive concepts.

The opening edge of the slave clock (edge #3) positioned early to the closing edge of the master clock (edge #4). Such an early opening of the slave clock as compared to the master closure results in the narrow transparent window, as depicted in FIG. 4c. The narrow transparent window created between the master clock and slave clock helps in avoiding the latency of the read operation. Further, the output of the memory device 200 may be toggled only during the narrow transparent window created between the master clock and the slave clock, which restricts the time window for the output/DOUT toggling.

The screening circuitry 206 monitors the toggling of the GRBL with respect to the closing edge of the master clock (edge #4) to screen if the bitcell 208 (e.g., by determining if the bitcell 208 is a weak bitcell and screening out the bitcell 208 if the bitcell 208 is determined to be a weak bitcell). The screening circuitry 206 detects the bitcell 208 is a weak bitcell, if the corresponding GRBL toggles beyond the closing edge of the master clock.

As depicted in FIG. 4c, consider that the GRBL outputs associated with the bitcells with 0 sigma, 3 sigma, and 6 sigma toggle before the closing edge of the master clock. In such a scenario, the screening circuitry 206 detects that the respective bitcells are not weak bitcells. Further, consider that the GRBL output from the bitcell with greater than 6 sigma toggles at the or beyond the closing edge (edge #4) of the master clock. In such a scenario, the screening circuitry 206 detects the respective bitcell as a weak bitcell. The screening circuitry 206 compares the sigma of the detected weak bitcell with the pre-defined sigma (for example, 6). As the sigma of the detected weak bitcell is greater than the pre-defined sigma, the screening circuitry 206 prevents the passing of the GRBL output to the data output terminal through the master slave flip-flop 220. Thus, the read operation may be failed, as depicted in FIG. 4c.

FIG. 5 is a flow diagram 500 depicting a method for managing the read operation of the memory device 200, according to at least some example embodiments of the inventive concepts.

At step 502, the method includes enabling, by the DOUT window controller 222, the master slave flip-flop 220 to store/latch the output of the at least one bitcell 208 during the read operation of the memory device 200. The memory device 200 includes the single ended read path. The master slave flip-flop 220 includes the master latch 220a and the slave latch 220b to store the output of the at least one bitcell 208.

At step 504, the method includes generating and controlling, by the DOUT window controller 222, the master clock for the master latch 220a to screen the at least one bitcell 208 (e.g., by determining if the at least one bitcell 208 is a weak bitcell and screening out the at least one bitcell 208 if the bitcell is determined to be a weak bitcell). Generating and controlling of the master clock for the master latch 220a are depicted in detail in conjunction with FIGS. 8 and 9, respectively.

At step 506, the method includes generating and controlling, by the DOUT window controller 222, the slave clock for the slave latch 220b to enable toggling of the output of the at least one bitcell 208 during the narrow transparent window between the master clock and the slave clock. Generating and controlling of the slave clock for the slave latch 220b are depicted in detail in conjunction with FIGS. 6 and 7, respectively. The various actions in method 500 may be performed in the order presented, in a different order or simultaneously. Further, in some embodiments, some actions listed in FIG. 5 may be omitted.

Figure 6:
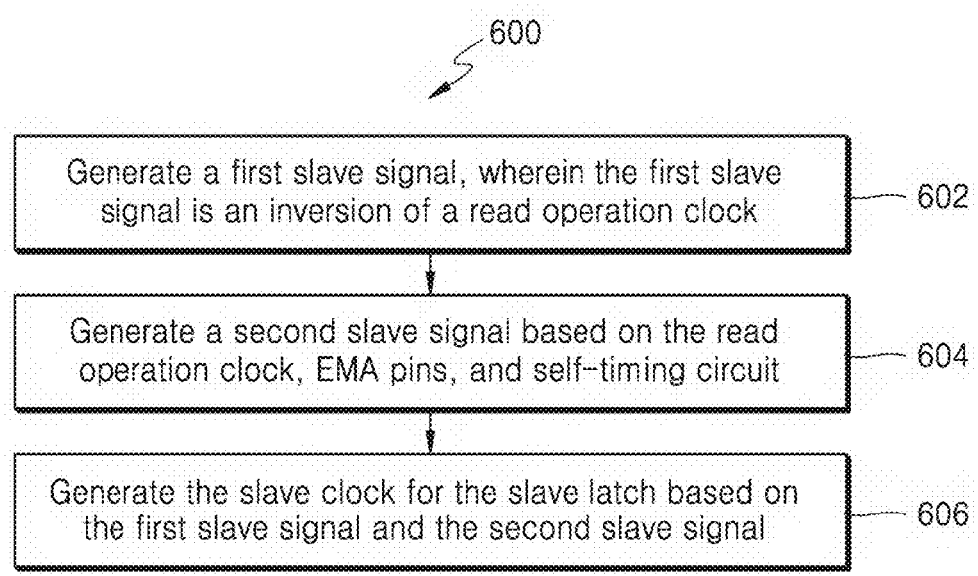
FIG. 6 is a flow diagram depicting a method for generating the slave clock for the slave latch, according to at least some example embodiments of the inventive concepts.

FIG. 6 is a flow diagram 600 depicting a method for generating the slave clock for the slave latch 220b, according to at least some example embodiments of the inventive concepts.

At step 602, the method includes generating, by the DOUT window controller 222, the first slave signal by inverting the read operation clock and the EMA pins.

At step 604, the method includes generating, by the DOUT window controller 222, the second slave signal based on the read operation clock.

At step 606, the method includes generating, by the DOUT window controller 222, the slave clock for the slave latch 220b based on the first slave signal and the second slave signal. The various actions in method 600 may be performed in the order presented, in a different order or simultaneously. Further, in some embodiments, some actions listed in FIG. 6 may be omitted.

Figure 7:
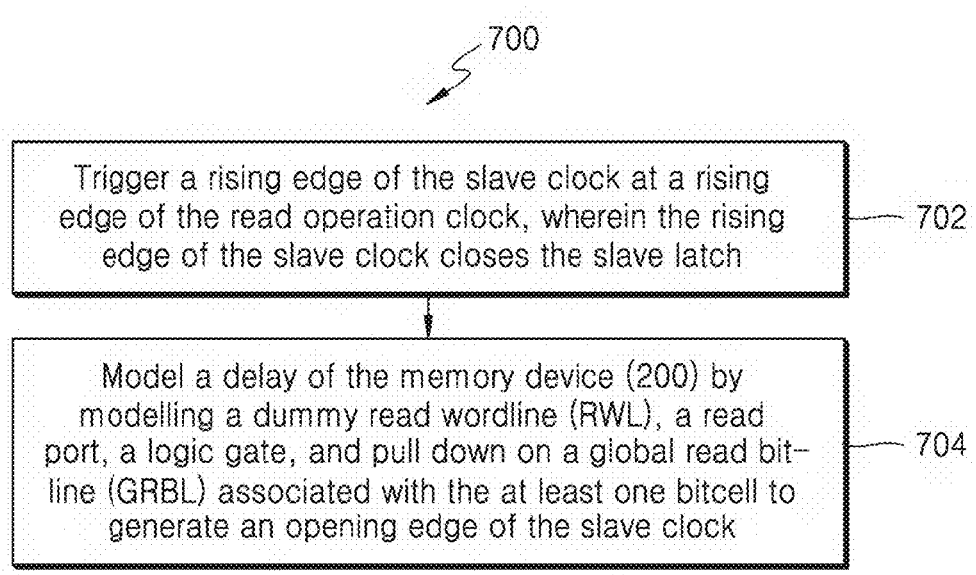
FIG. 7 is a flow diagram depicting a method for controlling the slave clock for the slave latch to enable the toggling of the output of the at least one bitcell in the narrow transparent window, according to at least some example embodiments of the inventive concepts.

FIG. 7 is a flow diagram 700 depicting a method for controlling the slave clock for the slave latch 220b to enable the toggling of the output of the at least one bitcell 208 in the narrow transparent window, according to at least some example embodiments of the inventive concepts.

At step 702, the rising edge of the read operation clock triggers the rising edge of the slave clock. The rising edge of the slave clock closes the slave latch 220b.

At step 704, modeling the delay of the memory device 200 by the DOUT window controller 222 to generate the opening edge of the slave clock. The opening edge of the slave clock may be generated before the closing edge of the master clock, which creates the narrow transparent window between the master clock and the slave clock. Thus, the DOUT/output of the bitcell 208 toggles only within the narrow transparent window. The various actions in method 700 may be performed in the order presented, in a different order or simultaneously. Further, in some embodiments, some actions listed in FIG. 7 may be omitted.

Figure 8:
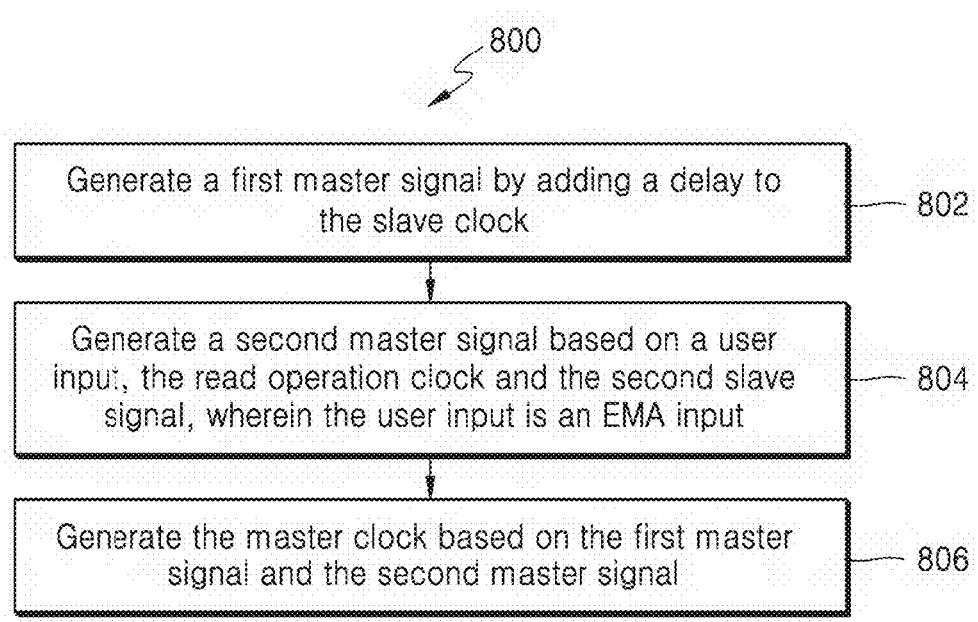
FIG. 8 is a flow diagram depicting a method for generating the master clock for the master latch, according to at least some example embodiments of the inventive concepts.

FIG. 8 is a flow diagram 800 depicting a method for generating the master clock for the master latch 222a, according to at least some example embodiments of the inventive concepts.

At step 802, the method includes generating, by the DOUT window controller 222, the first master signal by adding the delay to the slave clock generated by the slave clock generator 306.

At step 804, the method includes generating, by the DOUT window controller 222, the second master signal based on the user input/EMA pins, the read operation clock and the second slave signal.

At step 806, the method includes generating, by the DOUT window controller, the master clock based on the first master signal and the second master signal. The various actions in method 800 may be performed in the order presented, in a different order or simultaneously. Further, in some embodiments, some actions listed in FIG. 8 may be omitted.

Figure 9:
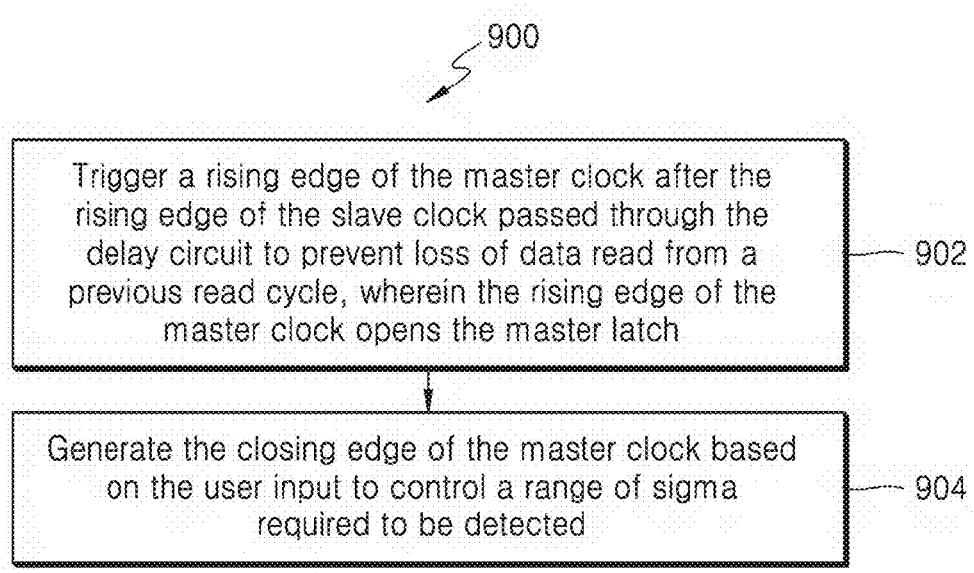
FIG. 9 is a flow diagram depicting a method for controlling the master clock for the master latch to screen the at least one weak bitcell, according to at least some example embodiments of the inventive concepts.

FIG. 9 is a flow diagram 900 depicting a method for controlling the master clock for the master latch 222a to screen out at least one weak bitcell, according to at least some example embodiments of the inventive concepts.

At step 902, the rising edge of the slave clock after passing through the delay circuit 308 triggers the rising edge of the master clock. The rising edge of the master clock opens the master clock.

At step 904, the closing edge of the master clock is generated by the EMA controller 310 to control the range of the sigma required to be detected. The GRBL output from the at least one bitcell may be monitored by the screening circuitry 206 with respect to the closing edge of the master clock to screen at least one bitcell 208 (e.g., by determining if the at least one bitcell 208 is a weak bitcell and screening out the at least one bitcell 208 if the at least one bitcell 208 is determined to be a weak bitcell). The various actions in method 900 may be performed in the order presented, in a different order or simultaneously. Further, in some embodiments, some actions listed in FIG. 9 may be omitted.

Figure 10:
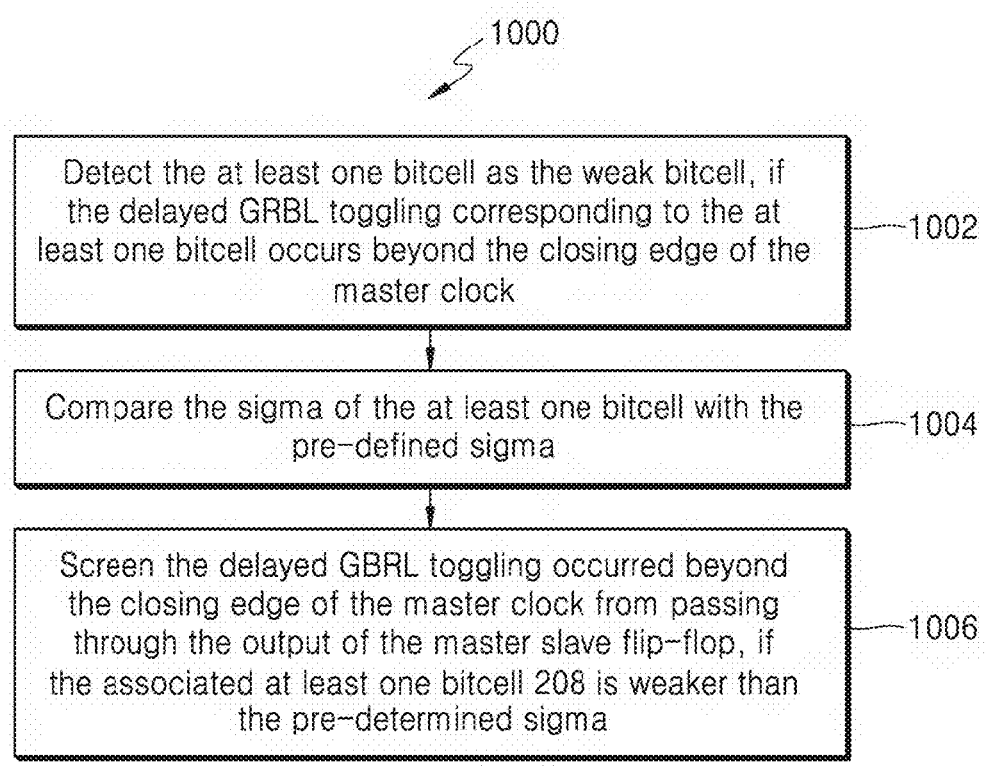
FIG. 10 is a flow diagram depicting a method for screening a weak bitcell, according to at least some example embodiments of the inventive concepts.

FIG. 10 is a flow diagram 1000 depicting a method for screening a weak bitcell, according to at least some example embodiments of the inventive concepts.

At step 1002, the method includes detecting, by the screening circuitry 206, the at least one bitcell 208 as a weak bitcell, if the delayed GRBL toggling corresponding to the at least one bitcell 208 occurs beyond the closing edge of the master clock.

At step 1004, the method includes comparing, by the screening circuitry 206, the sigma of the at least one bitcell 208 with the pre-defined sigma.

At step 1006, the method includes screening out/preventing the delayed GBRL toggling occurred beyond the closing edge of the master clock from passing through the output of the master slave flip-flop 220, if the associated at least one bitcell 208 is weaker than the pre-determined sigma. The various actions in method 1000 may be performed in the order presented, in a different order or simultaneously. Further, in some embodiments, some actions listed in FIG. 10 may be omitted.

At least some example embodiments of the inventive concepts manage a read operation of a memory device by improving:

- robustness: helps in screening out weak bitcells;
- performance: reduces output toggling window, which helps in achieving higher performance at a System On Chip (SOC) level; and
- latency: no latency is added to the read operation of the memory device, even though the memory device uses a master slave flip flop to store/latch an output of the bitcell.

At least some example embodiments of the inventive concepts can be implemented through at least one software program running on at least one hardware device and performing network management functions to control the elements. The elements shown in FIGS. 2a-2e, 3, and 4a can be at least one of a hardware device, or a combination of hardware device and software module.

At least some example embodiments of the inventive concepts describe methods and systems for managing read operation of memory device with single ended read path. Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method is implemented in at least one example embodiment of the inventive concepts through or together with a software program written in e.g., Very high speed integrated circuit Hardware Description Language (VHDL) another programming language, or implemented by one or more VHDL or several software modules being executed on at least one hardware device. The hardware device may be any kind of portable device that may be programmed. The device may also include means which could be e.g., hardware means like e.g., an ASIC, or a combination of hardware and software means, e.g., an ASIC and an FPGA, or at least one microprocessor and at least one memory with software modules located therein. Methods according to at least some example embodiments of the inventive concepts could be implemented partly in hardware and partly in software. Alternatively, at least some example embodiments of the inventive concepts may be implemented on different hardware devices, e.g., using a plurality of CPUs.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A memory device comprising:
   at least one bitcell;
   read circuitry coupled to the at least one bitcell; and
   screening circuitry coupled to the read circuitry, wherein the screening circuitry includes:
   a master slave flip-flop configured to:
     store an output of the at least one bitcell during a read operation of the memory device, wherein the master slave flip-flop includes a master latch and a slave latch; and
   a DOUT window controller coupled to the master slave flip-flop and configured to:
     generate and control a master clock signal for the master latch to determine whether the at least one bitcell is a weak bitcell having an output that toggles beyond a closing edge of the master clock signal; and
     generate and control a slave clock signal for the slave latch to enable toggling of the output of the at least one bitcell during a transparent window between the master clock signal and the slave clock signal.

2. The memory device of claim 1, wherein the memory device includes a single ended read data path.

3. The memory device of claim 1, wherein the DOUT window controller comprises:
   an inverter circuit;
   self-timing circuitry;
   a slave clock generator;
   a delay circuit;
   an extra margin adjustment (EMA) controller; and
   a master clock generator.

4. The memory device of claim 3, wherein
   the inverter circuit is configured to:
     generate a first slave signal based on an inversion of a read operation clock signal, and
     provide the generated first slave signal to the slave clock generator,
   the self-timing circuitry is configured to:
     generate a second slave signal based on the read operation clock signal and a user input, and
     provide the generated second slave signal to the slave clock generator, and
   the slave clock generator coupled to the inverter circuit and the self-timing circuitry is configured to:
     generate the slave clock signal for the slave latch based on the first slave signal and the second slave signal.

5. The memory device of claim 4, wherein
   the slave clock generator is further configured to:
     trigger a rising edge of the slave clock signal at a rising edge of the read operation clock signal, wherein the slave latch is configured such that the rising edge of the slave clock signal closes the slave latch; and
   the self-timing circuitry is further configured to:
     model a delay of the memory device by modelling a dummy read word line (RWL), a read port, a logic gate, and a global read bit-line (GRBL) pull down operation to generate an opening edge of the slave clock signal.

6. The memory device of claim 5, wherein the self-timing circuitry is configured to generate the opening edge of the slave clock signal before a closing edge of the master clock signal to create the transparent window between the master clock signal and the slave clock signal.

7. The memory device of claim 4,
   wherein the delay circuit is configured to:
     generate a first master signal by adding a delay to the slave clock signal generated by the slave clock generator, and
     provide the generated first master signal to the master clock generator, wherein the EMA controller is configured to:
     generate a second master signal based on the user input, the read operation clock signal and the second slave signal, wherein the user input is an EMA input, and
     provide the generated second master signal to the master clock generator, and
   wherein the master clock generator coupled to the delay circuit and the EMA controller is configured to:
     generate the master clock signal based on the first master signal and the second master signal.

8. The memory device of claim 7,
   wherein the master clock generator is further configured to:
     trigger a rising edge of the master clock signal after a rising edge of the slave clock signal passes through the delay circuit to prevent loss of data read from a previous read cycle, wherein the master latch is configured such that the rising edge of the master clock signal opens the master latch; and
   wherein the EMA controller is further configured to:
     generate a closing edge of the master clock signal based on the user input to control a range of sigma required to be detected.

9. The memory device of claim 8, wherein the screening circuitry is configured such that delayed GBRL toggling corresponding to the at least one bitcell occurring beyond the closing edge of the master clock signal is prevented, by the screening circuitry, from passing through an output of the master slave flip-flop, if the at least one bitcell is weaker than a first sigma, wherein the first sigma is a metric depicting strength of the at least one bitcell.

10. Screening circuitry in a memory device comprising:
a master slave flip-flop configured to:
store an output of at least one bitcell during a read operation of the memory device, wherein the master slave flip-flop includes a master latch and a slave latch; and
a DOUT window controller coupled to the master slave flip-flop configured to:
generate and control a master clock signal for the master latch to determine whether the at least one bitcell is a weak bitcell; and
generate and control a slave clock signal for the slave latch to enable toggling of the output of the at least one bitcell during a transparent window,
wherein the DOUT window controller generates the master clock signal and the slave clock signal based on user input to create the transparent window between a closing edge of the master clock signal and an opening edge of the slave clock signal.

11. A method for managing a read operation of a memory device,
the method comprising:
generating and controlling, by a DOUT window controller of screening circuitry, a master clock signal for a master latch of a master slave flip-flop to determine whether at least one bitcell is a weak bitcell having an output that toggles beyond a closing edge of the master clock signal, wherein the master slave flip-flop is configured to store an output of the at least one bitcell during the read operation of the memory device; and
generating and controlling, by the DOUT window controller, a slave clock signal for a slave latch of the master slave flip-flop to enable toggling of the output of the at least one bitcell during a transparent window between the master clock signal and the slave clock signal.

12. The method of claim 11, wherein the memory device includes a single ended read data path for reading the at least one bitcell.

13. The method of claim 11, wherein the generating and controlling of the slave clock signal for the slave latch comprises:
generating a first slave signal based on an inversion of a read operation clock signal;
generating a second slave signal based on the read operation clock signal and a user input; and
generating the slave clock signal for the slave latch based on the first slave signal and the second slave signal.

14. The method of claim 13, further comprising:
triggering, by the DOUT window controller, a rising edge of the slave clock signal at a rising edge of the read operation clock signal, wherein the rising edge of the slave clock signal closes the slave latch; and
modelling, by the DOUT window controller, a delay of the memory device by modelling a dummy read word-line (RWL), a read port, a logic gate, and a global read bit-line (GRBL) pull down operation associated with the at least one bitcell to generate an opening edge of the slave clock signal.

15. The method of claim 14, further comprising:
generating, by the DOUT window controller, the opening edge of the slave clock signal before a closing edge of the master clock signal to create the transparent window between the master clock signal and the slave clock signal.

16. The method of claim 13, wherein the generating and controlling of the master clock signal for the master latch comprises:
generating a first master signal by adding a delay to the slave clock signal;
generating a second master signal based on the user input, the read operation clock signal and the second slave signal, wherein the user input is an EMA input; and
generating the master clock signal based on the first master signal and the second master signal.

17. The method of claim 16, further comprising:
triggering, by the DOUT window controller, a rising edge of the master clock signal after a rising edge of the slave clock signal passes through a delay circuit to prevent loss of data read from a previous read cycle, wherein the rising edge of the master clock signal is a signal that opens the master latch; and
generating, by the DOUT window controller, a closing edge of the master clock signal based on the user input to control a range of sigma required to be detected.

18. The method of claim 17, further comprising:
preventing, by the screening circuitry, a delayed GBRL toggling of the at least one bitcell that occurred beyond the closing edge of the master clock signal from passing through an output of the master slave flip-flop, if the at least one bitcell is weaker than a first sigma, wherein the first sigma is a metric depicting strength of the at least one bitcell.

* * * * *